United States Patent
Yu et al.

(10) Patent No.: US 7,755,439 B2
(45) Date of Patent: Jul. 13, 2010

(54) PHASE LOCKED LOOP CIRCUIT PERFORMING TWO POINT MODULATION AND GAIN CALIBRATION METHOD THEREOF

(75) Inventors: Hwa Yeal Yu, Bucheon-si (KR); Dong Jin Keum, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 55 days.

(21) Appl. No.: 12/265,395

(22) Filed: Nov. 5, 2008

(65) Prior Publication Data

US 2009/0153254 A1 Jun. 18, 2009

(30) Foreign Application Priority Data

Nov. 5, 2007 (KR) ...................... 10-2007-0112367

(51) Int. Cl.
*H03C 3/06* (2006.01)
*H03L 7/00* (2006.01)
*H03L 7/06* (2006.01)
*H03L 7/08* (2006.01)
*H03L 7/093* (2006.01)
*H03L 7/18* (2006.01)

(52) U.S. Cl. ............................ 331/23; 331/14; 331/16; 331/17; 331/44; 332/128

(58) Field of Classification Search ................. 331/1 A, 331/8, 14, 16–18, 23, 25, 44; 332/127, 128
See application file for complete search history.

(56) References Cited

U.S. PATENT DOCUMENTS

| 6,998,922 B2 | 2/2006 | Jensen et al. |
| 2005/0156676 A1 | 7/2005 | Wang et al. |
| 2007/0040617 A1 | 2/2007 | Koukab et al. |
| 2008/0007365 A1* | 1/2008 | Venuti et al. ................ 331/179 |

FOREIGN PATENT DOCUMENTS

JP 2004-007433 1/2004

\* cited by examiner

*Primary Examiner*—David Mis
(74) *Attorney, Agent, or Firm*—F. Chau & Associates, LLC

(57) ABSTRACT

A PLL circuit for two point modulation includes a first loop filter, a second loop filter, a plurality of switching devices, and a calibration module. The first loop filter filters an output voltage of a charge pump during a gain calibration operation. The second loop filter filters the output voltage of the charge pump during a normal operation. The first loop filter has a bandwidth wider than that of the second loop filter to perform a fast calibration by reducing a lock time. The operation of the first loop filter, the operation of the second loop filter, and the opening of the first loop filter are determined by the switching operations of the switching devices. The calibration module adjusts a gain of analog modulation data based on a frequency error accumulated in the first loop filter after the first loop filter is open during the gain calibration operation.

20 Claims, 9 Drawing Sheets

PHASE LOCKED LOOP CIRCUIT PERFORMING TWO POINT MODULATION AND GAIN CALIBRATION METHOD THEREOF

CROSS REFERENCE TO RELATED APPLICATION

This application claims priority under 35 U.S. Section 119 to Korean Patent Application No. 10-2007-0112367, filed Nov. 5, 2007, in the Korean Intellectual Property Office, the disclosure of which is incorporated herein in its entirety.

BACKGROUND

1. Technical Field

The present disclosure relates to a phase locked loop circuit and a gain calibration method thereof and, more particularly, to a phase locked loop circuit that uses a loop filter having a wide bandwidth for a fast lock time during a calibration operation and calibrates a gain of analog modulation data based on a frequency error accumulated in the loop filter after the loop filter is open, and a method of calibrating the gain of the phase locked loop circuit.

2. Discussion of Related Art

Wireless communications devices such as cellular phones, personal digital assistants PDAs), personal computers (PCs), and broadcast equipment include transceivers for transceiving data. The transceiver when operating as a transmitter modulates data to a radio frequency (RF) signal according to a particular wireless communication regulation or standard and outputs the RF signal.

When operating as a receiver, the transceiver receives the RF signal from another communication device and recovers the data by demodulating the received RF signal according to the particular wireless communications regulation or standard. In general, the transceiver of a wireless communication device includes a phase locked loop (PLL) circuit for generating a signal having a stable frequency for performing a precise frequency modulation or demodulation.

The PLL circuit is designed to have a bandwidth narrower than that of the modulation data in order to provide a low noise characteristic. Accordingly, the PLL circuit uses so-called two point modulation to cover the overall bandwidth of the modulation data. According to the two point modulation, digital modulation data (DMD) is applied to a dividing circuit of the PLL circuit and simultaneously analog modulation data (AMD) is additionally applied to a voltage controlled, oscillator. The PLL circuit is capable of performing the two point modulation.

FIG. 1 is a graph showing the frequency characteristic of a PLL circuit when only digital modulation data DMD is applied. Referring to FIG. 1, when only the digital modulation data DMD is applied, it is seen that the PLL circuit operates as a low pass filter.

FIG. 2 is a graph showing the frequency characteristic of a PLL circuit when only analog modulation data AMD is applied. Referring to FIG. 2, when only the analog modulation data AMD is applied, it is seen that the PLL circuit operates as a high pass filter.

FIG. 3 is a graph showing the frequency characteristic of a PLL circuit when both of the digital modulation data DMD and the analog modulation data AMD are applied. Referring to FIG. 3, it is seen that in this case the PLL circuit operates as an all pass filter.

When the gains of the two routes are mismatched, however, it can be seen that in the PLL circuit a frequency characteristic, such as gain, changes according to a frequency range. Thus, when the gains of the two routes are mismatched, a calibration operation is needed to maintain the frequency characteristic of the PLL circuit constant.

SUMMARY OF THE INVENTION

To solve the above and/or other problems, exemplary embodiments of the present invention provide a phase locked loop circuit that uses a loop filter that has a wide bandwidth to reduce a lock time during a calibration operation and that can calibrate the gain of analog modulation data AMD based on a frequency error accumulated in the loop filter after the loop filter is open, and a method of calibrating the gain of the phase locked loop circuit.

According to an exemplary embodiment of the present invention, a PLL circuit for two point modulation comprises a first loop filter, a second loop filter, a plurality of switching devices, and a calibration module.

The first loop filter filters an output voltage of a charge pump that is generated based on channel data applied during a gain calibration operation. The second loop filter filters the output voltage of the charge pump that is generated based on the channel data and the modulation data applied during a normal operation. The first loop filter has a bandwidth wider than that of the second loop filter. Thus, the lock time of the phase locked loop during the calibration operation is shorter than that of the normal operation.

The calibration module adjusts the gain of the analog modulation data AMD based on a frequency error accumulated in the first loop filter according to the modulation data applied after the first loop filter is opened during the gain calibration operation. The PLL circuit further comprises a plurality of switching devices to select one of the first loop filter and the second loop filter according to the operation state of the PLL circuit.

The first loop filter comprises a switching device determining whether to open the first loop filter and a capacitor sensing an output voltage of the charge pump during the opening of the first loop filter. The capacitor is connected between an output terminal of the charge pump and a ground voltage.

The calibration module comprises a comparator, a calibration module, and a gain control unit. The comparator receives and compares the output voltage of the charge pump and an output voltage of the first loop filter after the first loop filter has been opened, and outputting a result of the comparison. The calibration circuit outputs a calibration value based on the comparison result. The gain control unit calibrates the gain of the modulation data based on the calibration value and outputs the gain calibrated modulation data. The gain control unit may be a multiplier multiplying the modulation data and the calibration value to output the gain calibrated modulation data.

The PLL circuit comprises a phase/frequency detector, a first adder, a second adder, a digital-to-analog converter, a voltage controlled oscillator, and a dividing circuit. The phase/frequency detector compares a phase/frequency of a reference signal and a phase/frequency of a feedback signal and generates a control signal to control the operation of the charge pump based on a result of the comparison.

The first adder adds the channel data and the modulation data and outputs digital modulation data. The digital-to-analog converter receives the gain calibrated modulation data, converts the gain calibrated modulation data to an analog voltage, and outputs analog modulation data. The second adder adds an output signal of a selected loop filter and the analog modulation data and outputs a result of the addition.

The voltage controlled oscillator generates an output signal having a frequency proportional to an output voltage of the second adder. The dividing circuit divides an output signal of the voltage controlled oscillator at a predetermined dividing ratio in response to the digital modulation data to generate the feedback signal. The PLL circuit may further comprise a sigma-delta modulator performing sigma-delta modulation to the digital modulation data and outputting sigma-delta modulated digital modulation data to the dividing circuit.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS 119a

Figure 1:
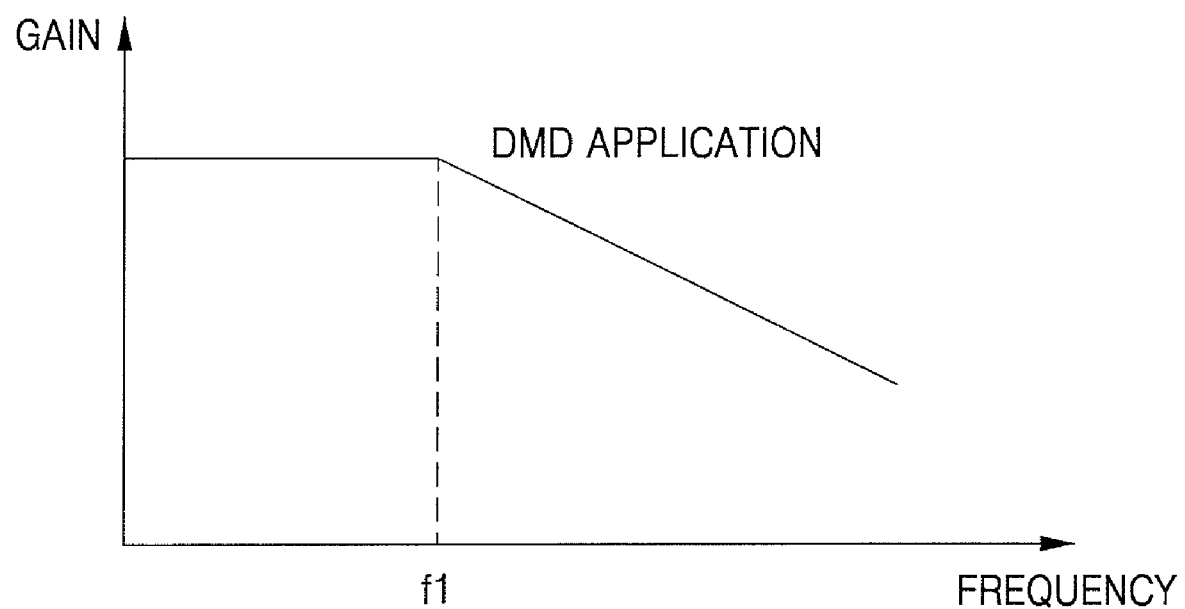
FIG. 1 is a graph showing the frequency characteristic of a PLL circuit for two point modulation when only digital modulation data DMD is applied.
Figure 2:
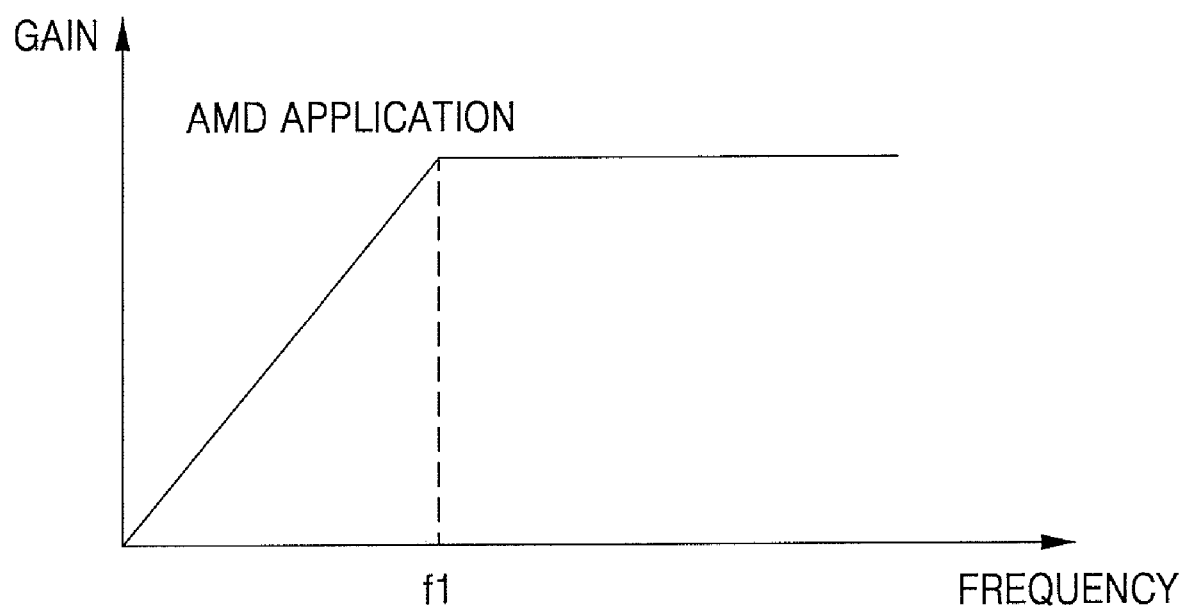
FIG. 2 is a graph showing the frequency characteristic of a PLL circuit for two point modulation when only analog modulation data DMD is applied.
Figure 3:
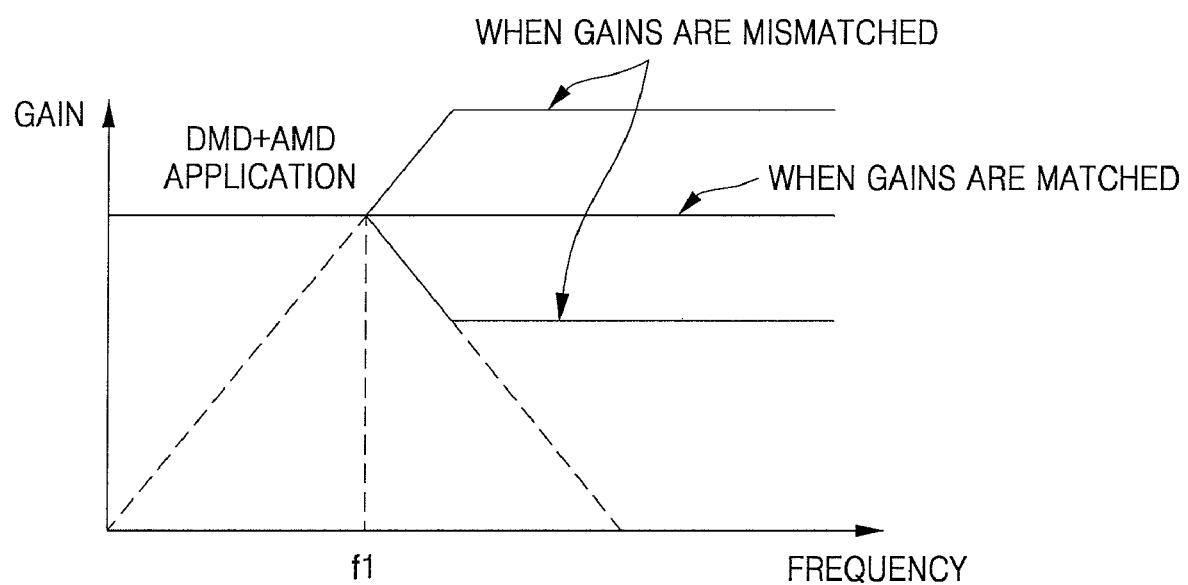
FIG. 3 is a graph showing the frequency characteristic of a PLL circuit for two point modulation when both of the digital modulation data DMD and the analog modulation data AMD are applied.

This application claims priority under 35 U.S. Section 119 to Korean Patent Application No. 10-2007-0112367, filed Nov. 5, 2007, in the Korean Intellectual Property Office, the disclosure of which is incorporated herein in its entirety.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments with reference to the attached drawings. Like reference numerals in the drawings denote like elements.

Figure 4:
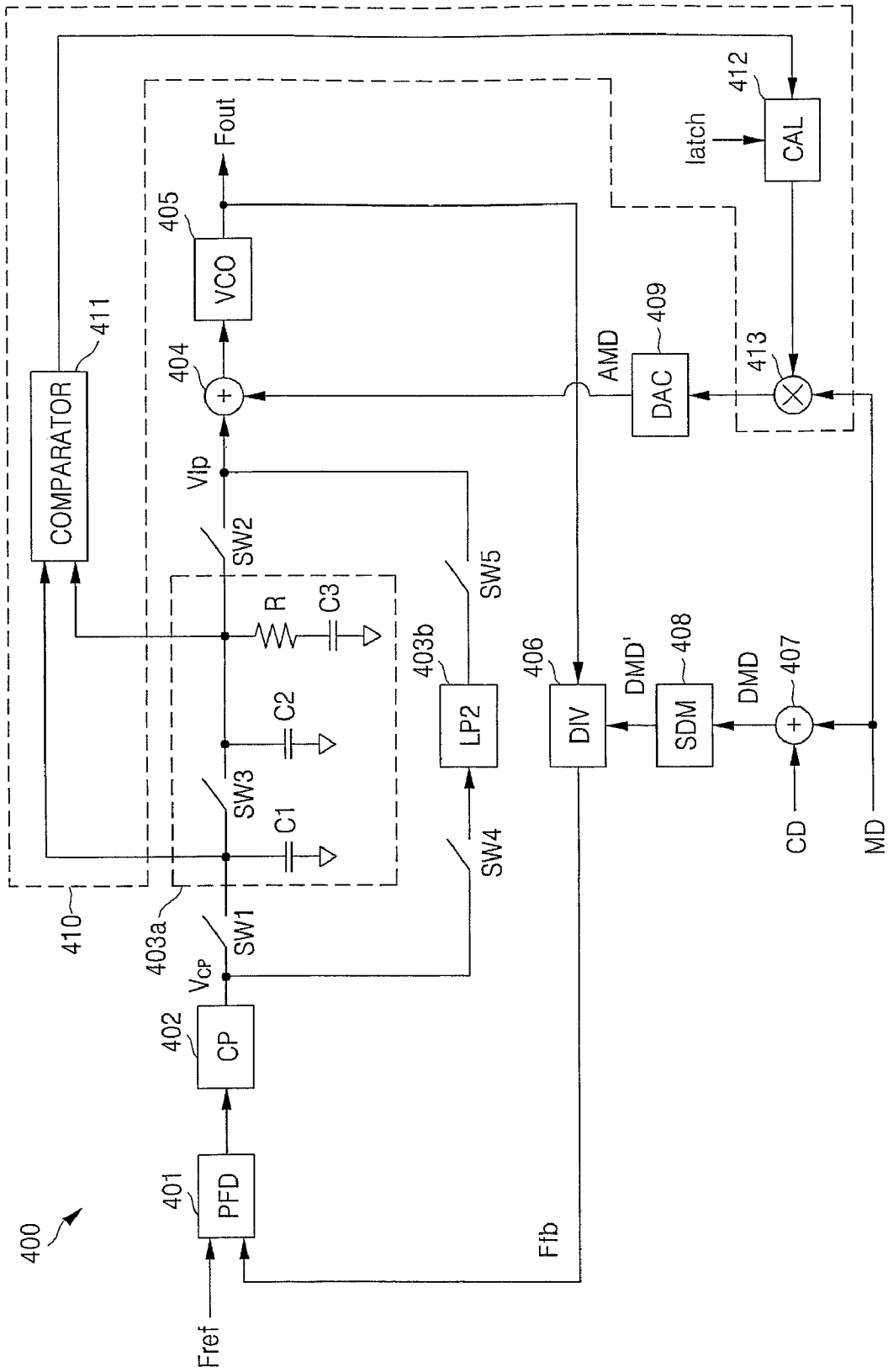
FIG. 4 is a circuit diagram of a PLL circuit for performing gain calibration using an open loop, according to an exemplary embodiment of the present invention.

FIG. 4 is a circuit diagram of a PLL circuit 400 for performing gain calibration using an open loop, according to an exemplary embodiment of the present invention. Referring to FIG. 4, the PLL circuit 400 includes a phase/frequency detector (PFD) 401, a charge pump (CP) 402, a first loop filter 403a, a second loop filter (LP2) 403b, a first adder 407, a digital-to-analog converter (DAC) 409, a second adder 404, a voltage controlled oscillator (VCO) 405, a dividing circuit (DIV) 406, and a calibration module 410.

The phase/frequency detector (PFD) 401 compares the phase/frequency of an externally supplied reference signal Fref with the phase/frequency of a feedback signal Fib and generates a control signal to control the operation of the charge pump (CP) 402 based on a result of the comparison. The charge pump (CP) 402 performs a charge pumping operation in response to the control signal.

For example, when the frequency of the reference signal Fref is higher than that of the feedback signal Ffb, the charge pump (CP) 402 may perform the charge pumping operation such that the level of an output voltage Vcp of the charge pump (CP) 402 can increase. When the frequency of the reference signal Fref is lower than that of the feedback signal Ffb, the charge pump (CP) 402 may perform the charge pumping operation such that the level of an output voltage Vcp of the charge pump (CP) 402 can decrease. When the frequencies of both signals are the same, the charge pump (CP) 402 will not perform the charge pumping operation.

The first loop filter 403a filters a voltage formed by the charge pumping operation of the charge pump (CP) 402, that is, the output voltage Vcp of the charge pump (CP) 402, when the PLL circuit 400 performs the gain calibration. The second loop filter (LP2) 403b filters a voltage formed by the charge pumping operation of the charge pump (CP) 402 when the PLL circuit 400 performs a normal operation after performing the gain calibration. The first loop filter 403a has a bandwidth wider than that of the second loop filter (LP2) 403b. This is to perform a fast calibration operation by means of the reduction of a lock time of an output signal Fout, rather than utilizing a noise characteristic.

The first loop filter 403a includes a switching device SW3 and a first capacitor C1. The opening of the first loop filter 403a is determined by the switching operation of the switching device SW3. The first capacitor C1 senses the output voltage Vcp of the charge pump (CP) 402 when the first loop filter 403a is open. The first capacitor C1 is connected between an output terminal of the charge pump (CP) 402 and a ground voltage. For fast voltage sensing, the capacitance of the first capacitor C1 is smaller than those of second and third capacitors C2 and C3 included in the first loop filter 403a and capacitors (not shown) constituting the second low pass filter (LP2) 403b.

The first adder 407 receives channel data (CD) and modulation data (MD) and outputs digital modulation data (DMD) that is a result of the addition of the channel data CD and modulation data MD. The PLL circuit 400 performs a sigma-delta modulation with respect to the DMD and may further include a sigma-delta modulator (SDM) 408 for outputting a sigma-delta modulated data DMD' to the DIV 406.

The sigma-delta modulator (SDM) 408 performs the sigma-delta modulation with respect to the digital modulation data DMD so that tone noise that may be generated when the divider (DIV) 406 performs fractional dividing by a particular frequency can be reduced. The PLL circuit 400 may her include a plurality of switching devices SW1, SW2, SW4, and SW5 to select a loop filter for filtering the output voltage Vcp of the CP 402 according to the operation state of the PLL circuit 400.

When the PLL circuit 400 performs gain calibration, a pair of the switches SW1 and SW2 are closed so that the first loop filter 403a forms a phase locked loop and the switching device SW3 of the first loop filter 403a repeats opening and closing. In contrast, when the PLL circuit 400 performs a normal operation, a pair of the other switches SW4 and SW5 are closed so that the second loop filter (LP2) 403b constitutes the phase locked loop.

The calibration module 410 calibrates gain of the analog modulation data AMD based on a frequency error accumulated in the first loop filter 403*a* based on the modulation data MD applied after the first loop filter 403*a* is open during the gain calibration operation. The calibration module 410 includes a comparator 411, a calibration circuit 412, and a gain control unit 413. The comparator 411 compares the voltage Vcp generated by the charge pumping after the first loop filter 403*a* and the output voltage of the first loop filter 403*a* and outputs a result of the comparison. The calibration circuit 412 outputs a calibration value based on the comparison result. The gain control unit 413 may adjust the gain of the analog modulation data AMD based on the calibration value. The gain control unit 413 may be embodied by a multiplier 413 for multiplying the modulation data (MD) and the calibration value to output an modulation data (MD) having adjusted gain to the digital-to-analog converter (DAC) 409. As a result, the multiplier 413 adjusts the gain of the analog modulation data (AMD) by adjusting the gain of a digital signal input to the digital-to-analog converter (DAC) 409.

The digital-to-analog converter (DAC) 409 receives the gain adjusted modulation data (MD), converts the received gain adjusted modulation data (MD) to an analog voltage, and outputs analog modulation data (AMD). The second adder 404 adds the output signal of the first loop filter 403*a* or the second loop filter (LP2) 403*b* and the analog modulation data (AMD) and outputs a result of the addition. The voltage controlled oscillator (VCO) 405 generates the output signal Fout having a frequency proportional to the output voltage of the second adder 404. The dividing circuit 406 in response to the digital modulation data (DMD or DMD') divides the output signal Fout of the VCO 405 at a predetermined dividing ratio to generate the feedback signal Ffb.

Figure 5:
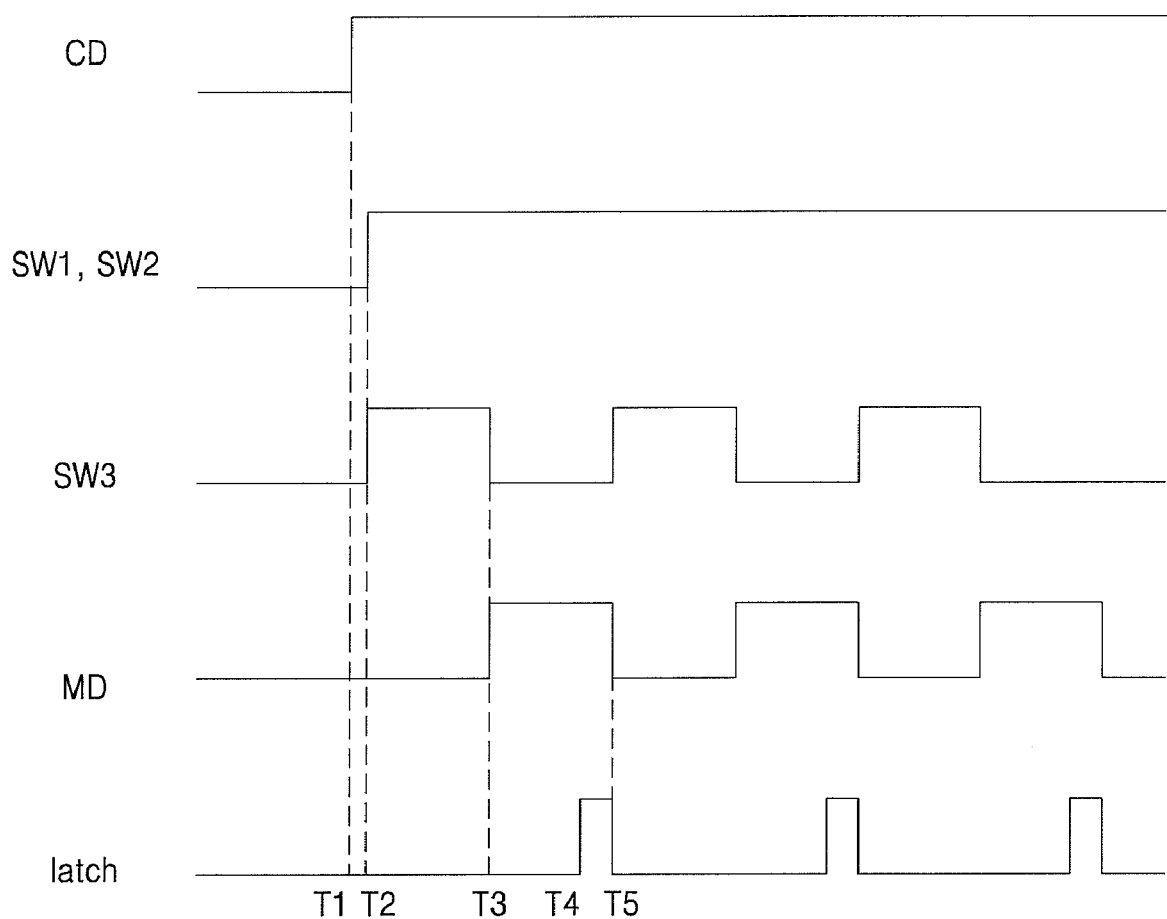
FIG. 5 is a timing diagram for explaining the gain calibration of the PLL circuit shown in FIG. 4.
Figure 6:
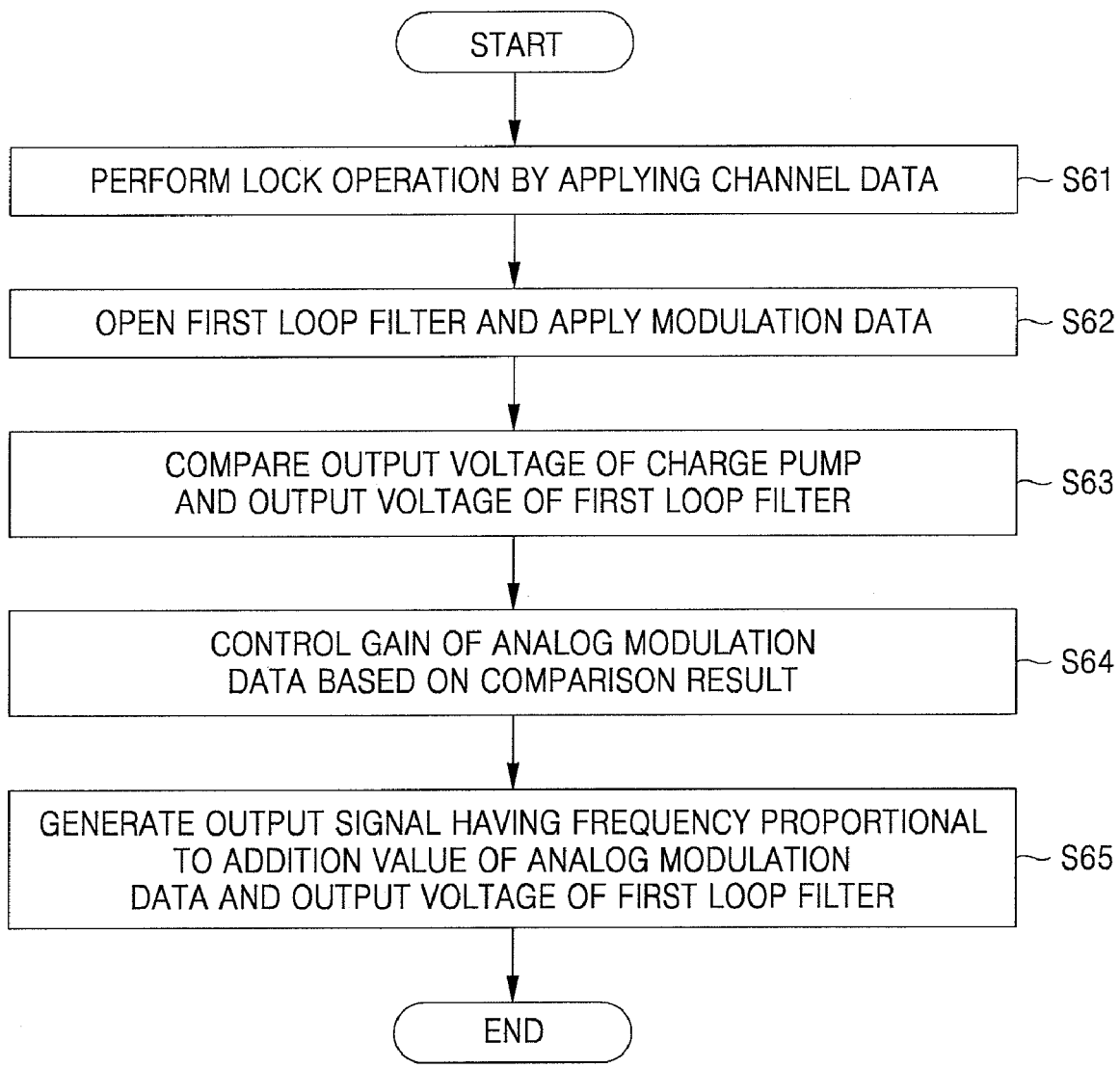
FIG. 6 is a flow chart for explaining a method of calibrating the gain of a PLL circuit according to an exemplary embodiment of the present invention.

FIG. 5 is a timing diagram for explaining the gain calibration of the PLL circuit 400 of FIG. 4. FIG. 6 is a flow chart for explaining a method of calibrating the gain of the PLL circuit 400 according to an exemplary embodiment of the present invention. Referring to FIGS. 4-6, in the calibration of the gain of the PLL circuit 400, the PLL circuit 400 performs a lock operation based on the channel data CD applied at a time point T1 at step S61. Because the first loop filter 403*a* forms a PLL loop, among the switching devices Sw1, SW2, SW4, and SW5 to select a loop filter to filter the output voltage Vcp of the charge pump (CP) 402, a pair of the switches SW1 and SW2 are closed and the other pair of the switches SW4 and SW5 are open, at a time point T2 shown in FIG. 5. Also, the switch SW3 to determine whether to open the first loop filter 403*a* is closed.

The PLL circuit 400 opens the switch SW3 at a time point T3 to open the first loop filter 403*a* and applies the modulation data MD in step S62. When the gains between a digital modulation DMD route and an analog modulation data AMD route are matched, because a frequency error is not generated between the reference signal Fref and the feedback signal Ffb, an additional calibration is not needed. When the gains between the two routes are mismatched, however, a frequency error is generated between the reference signal Fref and the feedback signal Ffb. A phase error of the phase/frequency detector (PFD) 401 of FIG. 4 linearly increases as time passes in response to the frequency error.

The output voltage Vcp of the charge pump (CP) 402 increases or decreases in proportion to the square of time based on the linear increase of the phase error. Because the switch SW3 is open, the output voltage Vcp of the charge pump (CP) 402 is sensed by the first capacitor C1 for sensing the voltage of the first loop filter 403*a*. The output voltage Vcp of the charge pump (CP) 402 quickly increases in proportion to the square of time. Because the capacitance of the first capacitor C1 is small, the output voltage Vcp of the charge pump (CP) 402 may be quickly and precisely sensed with respect to a small frequency error.

Figure 7:
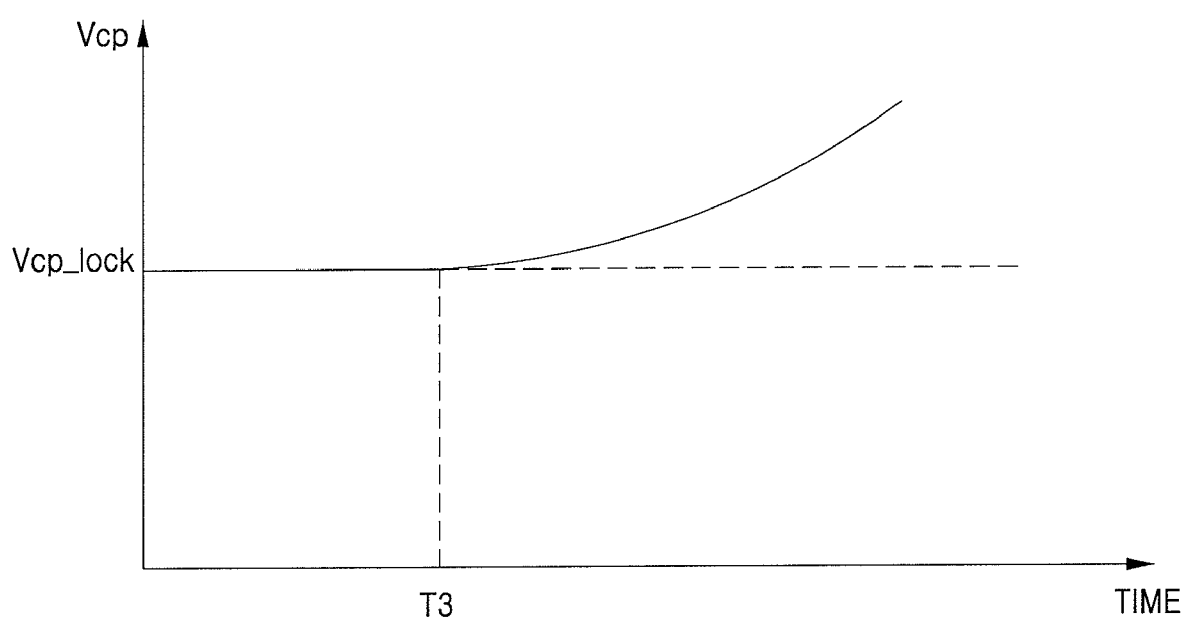
FIG. 7 is a graph showing the output voltage of the charge pump shown in FIG. 4.

FIG. 7 is a graph showing the output voltage Vcp of the charge pump (CP) 402 of FIG. 4. Referring to FIG. 7, after being locked to a predetermined voltage Vcp_lock by the channel data CD, the output voltage Vcp of the charge pump (CP) 402 increases in proportion to the square of time from the time point T3 when the modulation data MD is applied. This means that the output voltage Vcp of the charge pump (CP) 402 sensed by the first capacitor C1 increases when the frequency of the reference signal Fref is higher than that of the feedback signal Ffb after the modulation data MD is applied. The operation of the PLL circuit 400 when the frequency of the reference signal Fref is higher than that of the feedback signal Ffb is described below.

The comparator 411 receives and compares the output voltage Vcp of the charge pump (CP) 402 and an output voltage Vlp of the first loop filter 403*a* and outputs a result of the comparison at step S63. Because the output voltage Vcp of the charge pump (CP) 402 increases as time passes, the output voltage Vcp of the charge pump (CP) 402 is higher than the output voltage Vlp of the first loop filter 403*a*.

The calibration circuit 412 of FIG. 4 outputs a calibration value for controlling the gain of the modulation data MD input to the digital-to-analog converter (DAC) DAC 409 based on the comparison result and a latching signal (latch) applied at a time point T4 after a predetermined time passes after the modulation data MD is applied. The digital-to-analog converter (DAC) 409 converts the gain controlled modulation data (MD) to an analog voltage and generates the analog modulation data AMD in step S64.

The calibration circuit 412 outputs a calibration value to increase the gain of the modulation data MD input to the digital-to-analog converter (DAC) 409 so as to increase the frequency of the feedback signal Ffb. Thus, the voltage level of the analog modulation data AMD increases.

The second adder 404 adds the analog modulation data AMD and the output voltage of the first loop filter 403*a* and outputs a result of the addition to the voltage controlled oscillator (VCO) 405. The voltage controlled oscillator (VCO) 405 outputs the output signal Fout having a frequency proportional to the output voltage of the second adder 404 in step S65.

Because the voltage level of the analog modulation data AM increases, the voltage controlled oscillator (VCO) 405 outputs the output signal Fout having a frequency increased in proportion to the increased voltage of the analog modulation data AMD. Thus, the frequency of the feedback signal Ffb increases so that the frequency error of the reference signal Fref and the feedback signal Ffb is reduced.

The PLL circuit 400 repeats the operations of steps S61-S65 during a calibration time to calibrate the gain of the analog modulation data AMD. Thus, the gain mismatch between the digital modulation data DMD route and the analog modulation data AMD route may be calibrated.

The operation of the PLL circuit 400 when the frequency of the reference signal Fref is lower than that of the feedback signal Ffb is briefly described below. The PLL circuit 400 lowers the level of the analog voltage input to the second adder 404 by decreasing the gain of the modulation data MD input to the digital-to-analog converter (DAC) 409. Accordingly, because the output signal Fout of the voltage controlled oscillator (VCO) 405 decreases, the frequency of the feedback signal Ffb, which is a signal divided from the output signal Fout, decreases so that the gain calibration may be performed.

After the calibration time passes, the switches SW4 and SW5 are closed and a phase locked loop is formed by using the second loop filter 403b, so that the PLL circuit 400 performs a normal operation. The other switches SW1 and SW2 are open so that the operation of the calibration module 410 is stopped.

The method of calibrating gain of a PLL circuit according to the present exemplary embodiment may be embodied by hardware, software, firmware, or a combination thereof. When an exemplary embodiment of the present invention is embodied by software, the exemplary embodiment of the present invention may be embodied by computer readable codes or programs on a computer readable recording medium. The computer readable recording medium includes all sorts of recording devices, for example, RAM, ROM, EEPROM, or flash memory, for recording data that may be recognized by a computer system. The PLL circuit according to the present exemplary embodiment may be used for wireless communications devices, for example, cellular phones, PDAs, PCs, and broadcasting equipment, which need to generate a signal having a stable frequency or perform precise frequency conversion.

Figure 8:
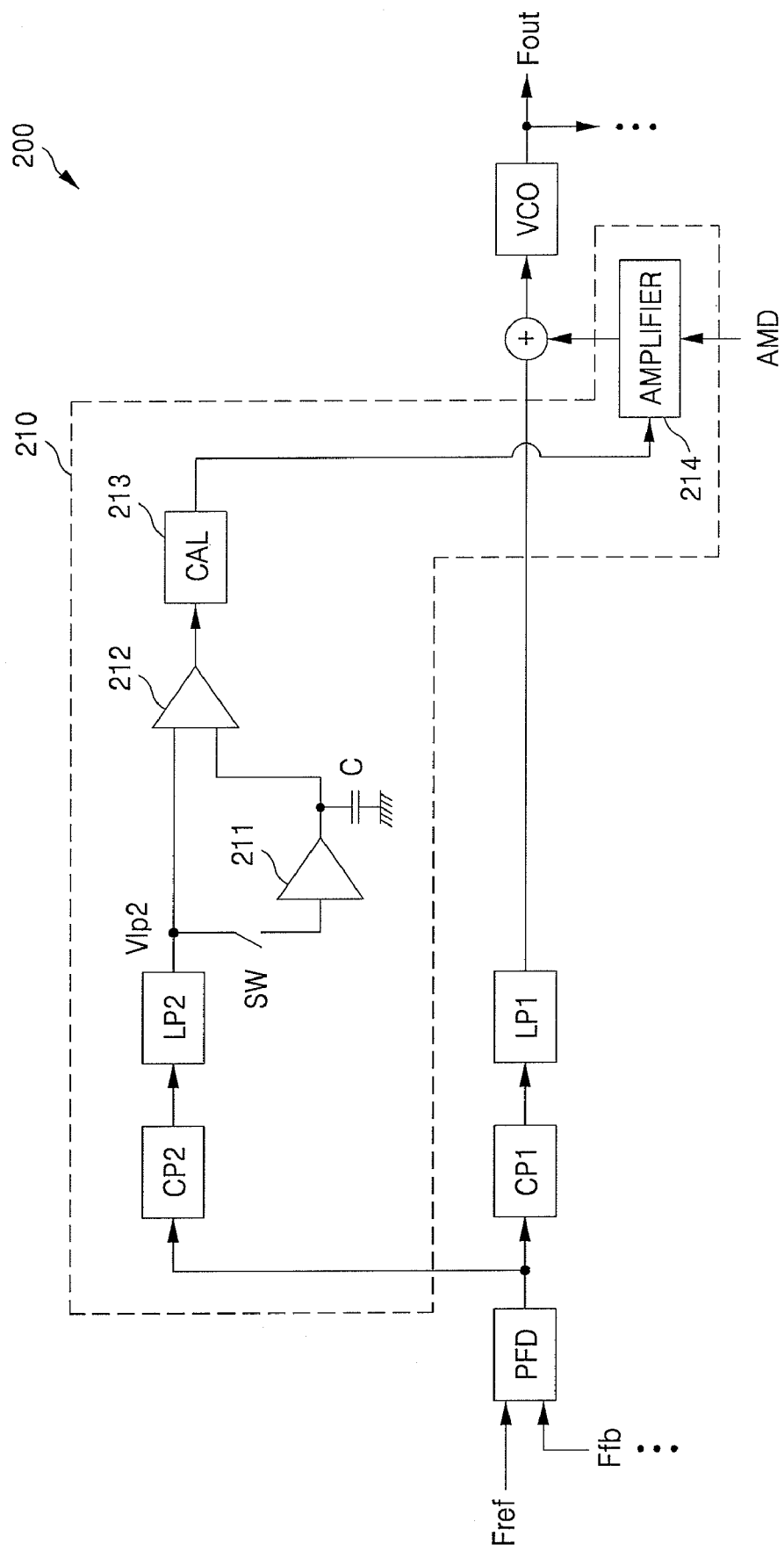
FIG. 8 is a circuit diagram of a PLL circuit performing gain calibration using a closed loop, providing an example for comparison with an exemplary embodiment of the present invention.

FIG. 8 is a circuit diagram of a PLL circuit 200 performing gain calibration using a closed loop and providing an example for comparison with the above-described exemplary embodiment of the present invention. Referring to FIG. 8, the PLL circuit 200 includes an additional calibration module 210 to perform a calibration operation. The calibration module 210 includes a charge pump CP2, a loop filter LP2, a switch SW, a buffer 211, a capacitor C, a comparator 212, a calibration circuit 213, and an amplifier 214.

In the operation of calibrating the gain of the analog modulation data AMD by the calibration module 210 and referring to the signals shown in FIG. 4, first, when the output signal Fout is locked as the channel data CD is applied, the switch SW is closed and an output voltage Vlp2 of the loop lifter LP2 is charged in the capacitor C via the buffer 211. Next, when the modulation data MD is applied, the switch SW is open and the comparator 212 compares the voltage charged in the capacitor C and the output voltage Vlp2 of the loop filter LP2 and outputs a result of the comparison.

The calibration circuit 213 calibrates a gain value of the amplifier 214 based on the comparison result such that a difference between the voltage charged in the capacitor C and the output voltage Vlp2 of the loop filter LP2 is reduced. Then, the amplifier 214 amplifies the analog modulation data AMD based on the calibrated gain value and outputs the amplified analog modulation data AMD.

The calibration method using a closed loop as shown in FIG. 8 has problems in which when the charge pumps CP1 and CP2 and loop filters LP1 AND LP2 are mismatched, sensing a small frequency error is difficult, it is difficult to set the precise data latching timing of the comparator 214 due to a ringing phenomenon of the output voltage Vlp2 of the loop filter LP2 when the gains between the two routes are mismatched, and the operation of the comparator 214 must be very precise because a change in the output voltage Vlp2 of the loop filter LP2 is small.

Figure 9:
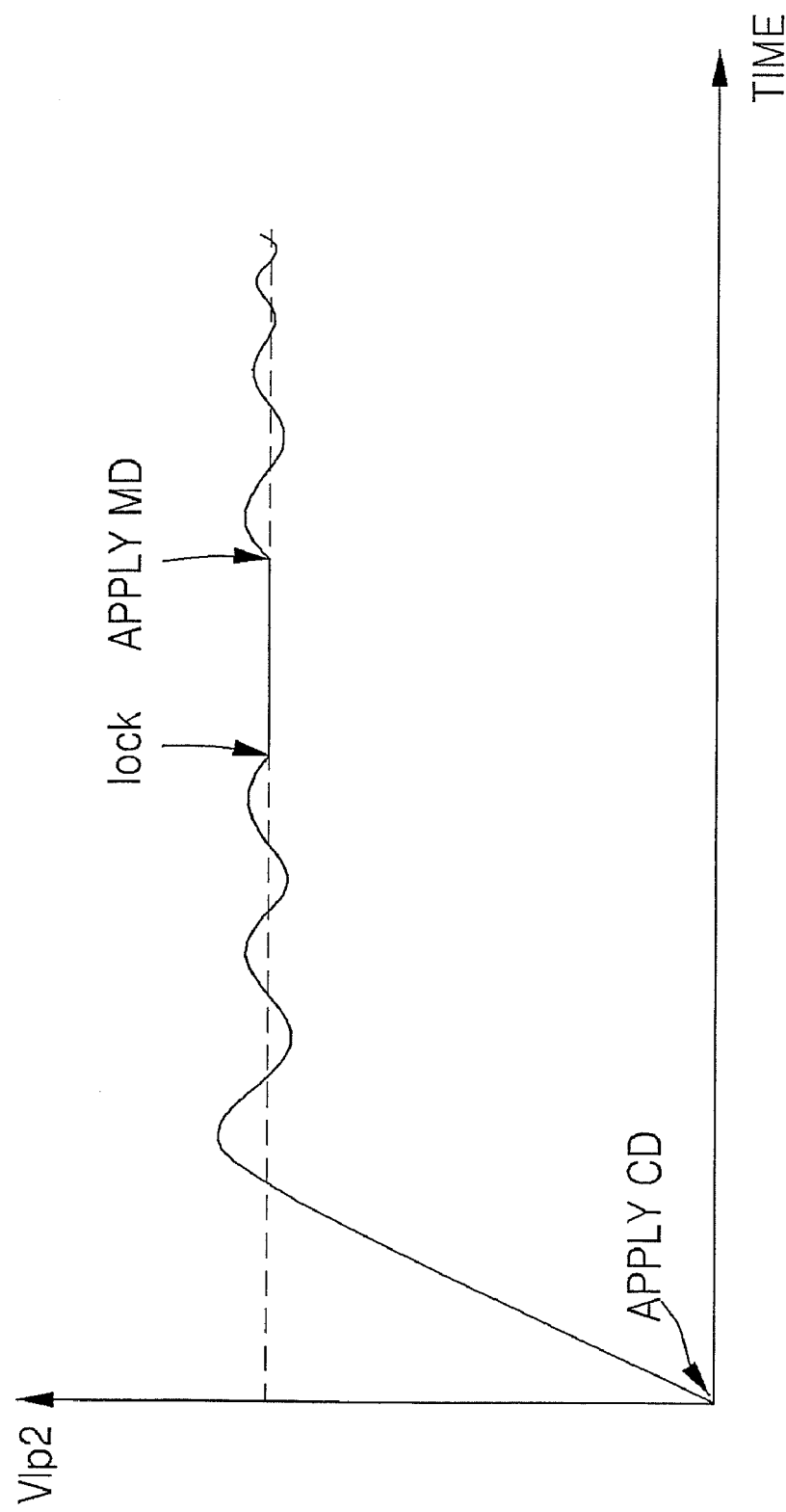
FIG. 9 is a graph showing a change in the output voltage of a loop filter circuit when modulation data is applied to the PLL circuit shown in FIG. 8.

FIG. 9 is a graph showing a change in the output voltage Vlp2 of the loop filter LP2 when the modulation data MD is applied to the PLL circuit 200 of FIG. 8. Referring to FIG. 9, a ripple is generated in the output voltage Vlp2 of the loop filter LP2 after the modulation data MD is applied. The amount of a change in the output voltage Vlp2 of the loop filter LP2 is smaller than that after the channel data CD is applied at the initial stage. Using an open loop, however, may solve the problems generated when the gain calibration operation is performed by using the closed loop, as described in connection with FIG. 8.

As described above, in the PPL circuit and the gain calibration method thereof according to an exemplary embodiment of the present invention, because the PLL circuit uses a loop filter having a wide bandwidth during the calibration operation, the lock time is reduced so that the gain calibration can be quickly performed. When the loop filter is open, because the gain of analog modulation data AMD is calibrated based on a frequency error accumulated in the loop filter, the gain calibration can be performed with respect to a small frequency error and the latching timing can be easily set.

While this invention has been particularly shown and described with reference to exemplary embodiments thereof, it will be understood by those of ordinary skill in the art that various changes in form and details may be made therein without departing from the spirit and scope of the invention, as defined by the appended claims.

What is claimed is:

1. A PLL circuit for two point modulation, the PLL circuit comprising:
   a first loop filter filtering an output voltage of a charge pump that is generated based on channel data applied during a gain calibration operation;
   a second loop filter filtering the output voltage of the charge pump that is generated based on the channel data and modulation data applied during a normal operation; and
   a calibration module adjusting a gain of analog modulation data based on a frequency error accumulated in the first loop filter according to the modulation data applied after the first loop filter is open during the gain calibration operation.

2. The PLL circuit of claim 1, further comprising a plurality of switching devices to select one of the first loop filter and the second loop filter according to an operation state of the PLL circuit.

3. The PLL circuit of claim 2, wherein the first loop filter has a bandwidth wider than a bandwidth of the second loop filter.

4. The PLL circuit of claim 3, wherein the first loop filter comprises:
   a switching device determining whether to open the first loop filter; and
   a capacitor sensing an output voltage of the charge pump when the first loop filter is open.

5. The PLL circuit of claim 4, wherein the capacitor is connected between an output terminal of the charge pump and a ground voltage.

6. The PLL circuit of claim 5, wherein the calibration module comprises:
   a comparator receiving and comparing the output voltage of the charge pump and an output voltage of the first loop filter after the first loop filter is open, and outputting a comparison result;
   a calibration circuit outputting a calibration value based on the comparison result; and
   a gain control unit calibrating a gain of the modulation data based on the calibration value and outputting gain calibrated modulation data.

7. The PLL circuit of claim 6, wherein the gain control unit comprises a multiplier multiplying the modulation data and the calibration value to output the gain calibrated modulation data.

8. The PLL circuit of claim 7, wherein the PLL circuit further comprises:
- a phase/frequency detector comparing a phase/frequency of a reference signal and a phase/frequency of a feedback signal based on an output of the PLL circuit and generating a control signal to control operation of the charge pump based on a result of the comparison;
- a first adder adding the channel data and the modulation data and outputting digital modulation data;
- a digital-to-analog converter receiving the gain calibrated modulation data, converting the gain calibrated modulation data to an analog voltage, and outputting analog modulation data;
- a second adder adding an output signal of a selected one of the first and second loop filters and the analog modulation data and outputting a result of the addition;
- a voltage controlled oscillator generating an output signal having a frequency proportional to an output voltage of the second adder; and
- a dividing circuit dividing an output signal of the voltage controlled oscillator at a predetermined dividing ratio in response to the digital modulation data to generate the feedback signal.

9. The PLL circuit of claim 8, further comprising a sigma-delta modulator performing sigma-delta modulation to the digital modulation data and outputting sigma-delta modulated digital modulation data to the dividing circuit.

10. A method of calibrating a gain of a PLL circuit during a gain calibrating operation using a first loop filter having a bandwidth wider than a bandwidth of a second loop filter operated during a normal operation, the method comprising:
- filtering an output voltage of a charge pump that is generated based on received channel data, using the first loop filter; and
- adjusting gain of analog modulation data based on a frequency error accumulated in the first loop filter according to received modulation data after the first loop filter is open during the gain calibration operation.

11. The method of claim 10, further comprising switching a plurality of switching devices to select one of the first loop filter and the second loop filter according to in operation state of the PLL circuit.

12. The method of claim 11, wherein the adjusting the gain of analog modulation data comprises:
- receiving and comparing the output voltage of the charge pump and an output voltage of the first loop filter after the first loop filter is open, and outputting a result of the comparison;
- outputting a calibration value based on the comparison result; and
- calibrating gain of the modulation data based on the calibration value and outputting gain calibrated modulation data.

13. A PLL circuit for two point modulation, the PLL circuit comprising:
- a first loop filter filtering an output voltage of a charge pump that is generated based on channel data applied during a gain calibration operation;
- a second loop filter filtering the output voltage of the charge pump that is generated based on the channel data and modulation data applied during a normal operation;
- a first plurality of switching devices for selecting the first loop filter in the PLL circuit during a gain calibration operation;
- a second plurality of switching devices for selecting the second loop filter in the PLL circuit during a normal operation; and
- a calibration module adjusting a gain of analog modulation data based on a frequency error accumulated in the first loop filter according to the modulation data applied after the first loop filter is open during the gain calibration operation.

14. The PLL circuit of claim 13, wherein the first loop filter has a bandwidth wider than a bandwidth of the second loop filter.

15. The PLL circuit of claim 14, wherein the first loop filter comprises:
- a capacitor sensing an output voltage of the charge pump when the first loop filter is open by the first plurality of switching devices.

16. The PLL circuit of claim 14, wherein the capacitor is connected between an output terminal of the charge pump and a ground voltage.

17. The PLL circuit of claim 16, wherein the calibration module comprises:
- a comparator receiving and comparing the output voltage of the charge pump and an output voltage of the first loop filter after the first loop filter is open, and outputting a comparison result;
- a calibration circuit outputting a calibration value based on the comparison result; and
- a gain control unit calibrating a gain of the modulation data based on the calibration value and outputting gain calibrated modulation data.

18. The PLL circuit of claim 17, wherein the gain control unit comprises a multiplier multiplying the modulation data and the calibration value to output the gain calibrated modulation data.

19. The PLL circuit of claim 18, wherein the PLL circuit further comprises:
- a phase/frequency detector comparing a phase/frequency of a reference signal and a phase/frequency of a feedback signal based on an output of the PLL circuit and generating a control signal to control operation of the charge pump based on a result of the comparison;
- a first adder adding the channel data and the modulation data and outputting digital modulation data;
- a digital-to-analog converter receiving the gain calibrated modulation data, converting the gain calibrated modulation data to an analog voltage, and outputting analog modulation data;
- a second adder adding an output signal of a selected one of the first and second loop filters and the analog modulation data and outputting a result of the addition;
- a voltage controlled oscillator generating an output signal having a frequency proportional to an output voltage of the second adder; and
- a dividing circuit dividing an output signal of the voltage controlled oscillator at a predetermined dividing ratio in response to the digital modulation data to generate the feedback signal.

20. The PLL circuit of claim 19, further comprising a sigma-delta modulator performing sigma-delta modulation to the digital modulation data and outputting sigma-delta modulated digital modulation data to the dividing circuit.

* * * * *